Oct. 8, 1968 J. M. HOWE 3,405,368

BAND-PASS AMPLIFIER USING FIELD EFFECT TRANSISTORS

Filed Dec. 30, 1965

INVENTOR.
JAMES M. HOWE
BY
ATTORNEYS

United States Patent Office 3,405,368

Patented Oct. 8, 1968

3,405,368

BAND-PASS AMPLIFIER USING FIELD EFFECT TRANSISTORS

James M. Howe, Westminster, Calif., assignor to the United States of America as represented by the Secretary of the Navy Filed Dec. 30, 1965, Ser. No. 517,871

4 Claims. (Cl. 330—21)

ABSTRACT OF THE DISCLOSURE

A narrow-bandwidth band-pass amplifier utilizing field-effect transistors. A summing amplifier is provided with feedback between its output and one of its inputs. The feedback path comprises an inverter and a parallel-T notch filter circuit. At the notch frequency of the filter the amplifier has its maximum output.

This invention relates to band-pass amplifiers and more particularly to a narrow-bandwidth band-pass amplifier which uses field-effect transistors.

It is often necessary in electronic circuit work to have available an amplifier which will receive signals of various frequencies but amplify only those having some preselected desired frequency. Such amplifiers are commonly known as band-pass amplifiers. The ultimate goal in designing such an amplifier for some applications is to have the selectivity of said amplifier as sharp as possible. In other words, the amplifier amplifies only signals whose frequency falls within a very narrow range and fails to amplify any signals whose frequencies fall outside of such a narrow range.

When working with signals of relatively high frequencies, tuned amplifiers produce satisfactory results, but when the desired band-pass frequency is relatively low such techniques prove inadequate. The latter is true, among other reasons, because of the fact that tuned networks may become rather cumbersome at the lower frequencies, e.g., sixty seconds cycles per second.

An object of this invention therefore is to produce a band-pass amplifier having a very narrow bandwidth.

Another object of this invention is to produce a narrow-bandwidth band-pass amplifier capable of operation on relatively low frequencies.

A further object of this invention is to produce a very selective low-frequency band-pass amplifier utilizing solid state techniques.

A still further object of this invention is to produce a high-selectivity band-pass amplifier utilizing field-effect transistors.

The above objects are achieved within the scope of this invention by utilizing a summing amplifier having two high impedance inputs. The output is inverted and proportional to the sum of signals appearing at the two inputs. Output signals are passed on to a buffer stage which maintains essentially unity voltage gain while having a very low impedance output.

Signals at the buffer stage output are supplied to the input of a parallel-T filter circuit. The filter is designed to substantially pass all frequencies other than the desired band-pass frequency of the overall bandpass amplifier. Signals at the output of the filter are supplied to the other high impedance input of the summing amplifier. At frequencies other than the band-pass frequency the summing amplifier is supplied with two input signals, one being the inverted image of the other. A cancellation of the two therefore occurs in the output of the summing amplifier. At the band-pass frequency, however, the amplitude of the signal on the second input of the summing amplifier is extremely small with the result that the cancellation evident at other frequencies does not occur and the maximum output is produced by the summing amplifier.

The above and other objects and features of this invention will be better understood from the following detailed description in conjunction with the attached drawings wherein.

Figure 1:
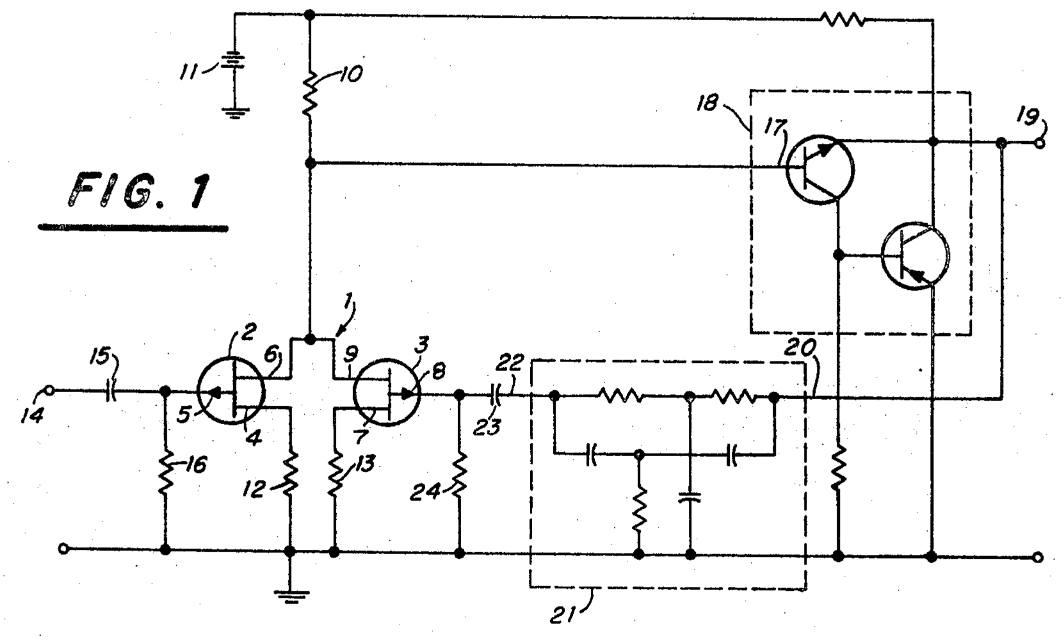
FIG. 1 is a schematic diagram of an embodiment of this invention.

Referring now to FIG. 1 there is shown a summing amplifier 1 comprising field effect transistors 2 and 3. Field effect transistors 2 and 3 have source, gate and drain elements 4, 5, and 6 and 7, 8 and 9, respectively. The drain elements 6 and 9 are connected together to a common point and to one end of a load resistance 10. The other end of resistance 10 is supplied with operating potential from source 11. The source elements 4 and 7 are connected to ground through source resistors 12 and 13, respectively. Input signals are supplied to the gate 5 of field effect transistor 2 from input terminal 14 through the coupling capacitor 15. An input resistance 16 is connected between gate 5 and a common ground point.

Output signals at the output of summing amplifier 1, i.e., the common connection between drains 6 and 9, are supplied to the input 17 of the buffer stage 18. The buffer amplifier stage 18 comprises a pair of complementary symmetry transistors arranged in an emitter follower configuration. Such a configuration is characterized by the very low output impedance at output terminal 19. The buffer stage has a voltage gain of substantial unity and consequently its primary purpose is for isolation. The output from terminal 19 is fed back to input 20 of a filter circuit 21. For best results the parallel-T configuration filter is used in its conventional form. The parallel-T filter is characterized by a sharp attenuation characteristic at some selected frequency while substantially passing frequencies other than said selected one. Signals at output 22 of the filter 21 are coupled to gate element 8, i.e., the second input of the summing amplifier 1, through coupling capacitor 23. Input resistance 24 is connected between gate 8 and the common ground as shown.

Considering now the theory of operation of the circuit, it should be noted that a parallel-T type filter theoretically should have a zero impedance input source and an infinite impedance load for the best selectivity characteristic. These conditions are approached by the very low output impedance of the buffer stage 18 and the very high input impedance of field effect transistor 3. The input impedance of a unipolar transistor such as an FET is very high since the input terminal is essentially looking into a reverse biased junction. The filter 21 is therefore operated in as near ideal surroundings as possible.

To permit summing amplifier 1 to be responsive to signals within a substantial dynamic range, field effect transistors 2 and 3 are operated under class A conditions. Furthermore, the gain of field effect transistor 3 is arranged to be considerably more than that of transistor 2, e.g., 3 to 4 times, by making the resistance of resistor 13 less than that of resistance 12 for example. This provides additional gain in the feedback loop through the filter.

In operation, when a signal having a frequency other than the maximum attenuation frequency of filter 21 is supplied to input terminal 14 and consequently, gate 5, gate 8 will receive an inverted image of such a signal since filter 21 fails to attenuate it. The face that the signal is inverted is, of course, due to the FET 2 whose output at its drain is 180° out of phase with its input at its gate. Since summing amplifier 1 is, therefore, supplied at its input with two signals of the same frequency but opposite polarity a cancellation takes place in its output and consequently said output is at a minimum. Now considering the case of reception of a signal having a frequency equal to the maximum attenuation frequency of filter 21, the operation will be somewhat different. Gate terminal 8 will not receive an input signal since filter 21 has substantially attenuated the signal presented to it. The output of the summing amplifier 1 is, therefore, at a maximum since the only signals present at said output are an amplified version of the input signals at gate 5. No cancellation, therefore, takes place and the circuit has greater output amplitude than at frequencies other than the maximum attenuation frequency of the filter network.

Figure 2:
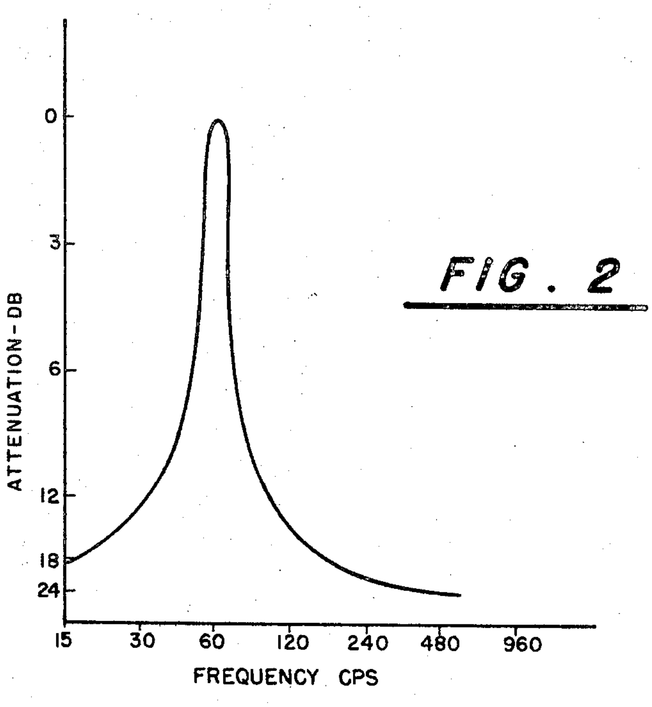
FIG. 2 is a graph of the selectivity characteristics of the embodiment of FIG. 1.

Referring now to FIG. 2, a graph of the overall selectivity of a circuit constructed in accordance with this invention is shown. The graph of FIG. 2 is a plot of attenuation in decibels versus frequency in cycles per second. As may be noted from the graph, the maximum attenuation frequency of the filter, and therefore, the band-pass frequency of the overall amplifier, was chosen to be sixty cycles per second in the model constructed. It may be noted from the graph that the attenuation increases very rapidly as the frequency is varied from the band-pass frequency of sixty cycles per second.

It can, therefore, be seen that this invention provides a band-pass amplifier which has very good selectivity at relatively low frequencies.

Although a specific embodiment of the invention has been shown and described, it will be understood that various modifications may be made without departing from the spirit and scope of the invention as defined in the appended claims.

What is claimed is:

1. A narrow bandwidth band-pass amplifier comprising:

a summing amplifier having first and second inputs and a common output and adapted to produce a signal at said common output proportional to the sums of any signals at its first and second inputs and comprising, a first field-effect transistor having a source, a drain and a gate element, a second, field-effect transistor having a source, a drain and a gate element, said drain elements of said first and second field-effect transistors being connected together and to a common load resistor, said drain connection being said common output of said summing amplifier, said gate elements of said first and second field effect transistors being said first and second inputs, respectively, of said summing amplifier, a first resistor connected between the source element of said first field effect transistor and a common ground point, a second resistor connected between the source element of said second field effect transistor and a common ground point, said signal at said common output being inverted with respect to signals at said first and second inputs, said second input of said summing amplifier having a high input impedance, a buffer amplifier having an input and a low impedance output, said buffer amplifier input being adapted to receive a signal from said output of said summing amplifier, a filter circuit for substantially passing signals having frequencies other than a selected one, said selected one being substantially attenuated, said filter circuit having an input which is connected to said buffer output, said filter circuit further having an output coupled to said second input of said summing amplifier, whereby said summing amplifier has a maximum output when a signal having a frequency equal to said selected one of said filter circuit is received at said first input.

2. The apparatus of claim 1 wherein said filter circuit is of the parallel-T type.

3. The apparatus of claim 1 wherein said second resistor has a resistance less than said first resistor whereby the gain of said second field-effect transistor is higher than that of said first.

4. The apparatus of claim 1 wherein said buffer amplifier comprises a transistor amplifier arranged in an emitter-follower configuration, the output of said buffer amplifier being the final output of said band-pass amplifier.

References Cited

UNITED STATES PATENTS

| | | | |
|---|---|---|---|
| 3,095,542 | 6/1963 | Fusfield et al. | 330—109 X |
| 3,265,981 | 8/1966 | Dill | 330—38 X |
| 3,296,546 | 1/1967 | Schneider | 330—28 X |

FOREIGN PATENTS

Theory and Application Notes, No. 2, of Amelco Semiconductor "Field Effect Transistors," June 1962, p. 4.

Rhinehart et al.: "FET Performs Well In Balancing Act," Electronics, Sept. 20, 1965, pp. 88–92.

ROY LAKE, *Primary Examiner.*

JAMES B. MULLINS, *Assistant Examiner.*